(12) United States Patent
Stewart et al.

(10) Patent No.: US 7,343,812 B2
(45) Date of Patent: Mar. 18, 2008

(54) METHOD TO REDUCE DIE EDGE SHORTING ON PRESSURE SENSORS USING CONDUCTIVE ELASTOMERIC SEALS

(75) Inventors: Carl E. Stewart, Plano, TX (US); Richard A. Davis, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/453,509

(22) Filed: Jun. 15, 2006

(65) Prior Publication Data

US 2007/0289387 A1      Dec. 20, 2007

(51) Int. Cl.
    *G01L 7/00*        (2006.01)
(52) U.S. Cl. ........................................ 73/756; 438/479
(58) Field of Classification Search .................. 73/754; 438/479
    See application file for complete search history.

(56) References Cited

U.S. PATENT DOCUMENTS

| | | | |
|---|---|---|---|
| 5,184,107 A | 2/1993 | Maurer | 338/42 |
| 6,826,966 B1 | 12/2004 | Karbassi et al. | 73/861.52 |
| 7,129,525 B2 * | 10/2006 | Uematsu et al. | 257/94 |

* cited by examiner

*Primary Examiner*—Andre J. Allen
(74) *Attorney, Agent, or Firm*—Luis M. Ortiz; Kermit D. Lopez

(57) ABSTRACT

A pressure sensor includes a sensing element fabricated on an N-type epitaxial layer grown on a P-type substrate, a P-type isolation region located around the edge of the sensing element die and in contact with the P-type substrate, and a conductive elastomeric seal engaging the P-type isolation region prevents shorting of the conductive elastomeric seal with the N-type epitaxial layer of the sensing element die. A method of making a pressure sensor comprises growing an n-type epitaxy layer on a p-type substrate wafer, resulting in a pressure sensor die and substrate having an edge, obtaining a mask adapted for fabricating an isolation diffusion layer around the edge using P-type material, and creating an isolation layer diffusion using P-type doping material around the edge using the mask. A conductive elastomeric seal can then be placed over the sensor die to make electrical contact to the package.

18 Claims, 2 Drawing Sheets

METHOD TO REDUCE DIE EDGE SHORTING ON PRESSURE SENSORS USING CONDUCTIVE ELASTOMERIC SEALS

TECHNICAL FIELD OF THE INVENTION

The present invention is generally related to semiconductor pressure sensors. The present invention is also related to elastomeric seals. More particularly, the present invention is related to a fabrication process that reduces die edge shorting on pressure sensors utilizing conductive elastomeric seals.

BACKGROUND

Typical semiconductor pressure sensors use solid state sensing elements that are not compatible with liquids. When the pressure of a liquid is being sensed, these devices require complicated packaging schemes to mount the sensing element and to protect that element from the fluid passing through the pressure sensor package.

A packaging scheme is known for a pressure gauge such that the pressure gauge can be used to detect the pressure of either a liquid or a gas. The package of this pressure gauge includes a solid state pressure sensing element and elastomeric seals. The pressure gauge detects any change in pressure of a fluid. In past designs, at least one of the elastomeric seals is conductive so as to connect signals from the solid state pressure sensing element to electrical leads that exit the housing of the pressure gauge. This type of pressure gauge is shown in U.S. Pat. No. 5,184,107 issued to Dean J. Maurer on Feb. 2, 1993. Also, the pressure sensor described in U.S. Pat. No. 6,826,966 issued to Karbassi et al on Dec. 7, 2004 integrates a pressure sensing element and a restriction into a low-cost, highly-manufacturable sensor package. The Karbassi et al packaging arrangement exposes the pressure sensing element to the gas or fluid flow but protects the susceptible regions of the pressure sensing element from the gas or fluid without the need for other protective devices.

Industry has been experiencing a problem wherein conductive elastomeric seals cause shorting when and if they wrap over the edge of the die. When a conductive elastomeric seal wraps around the edge of a die associated with a pressure sensor, it can short out the Wheatstone bridge or other electronic circuitry located on the sensor package.

Pressure sensors packaged using the elastomeric seals have an inherent problem with the seal that is conductive if perfect alignment is not held when the package is snapped together and the seals are compressed because elastomeric seals are impregnated with thin silver strips. The strips themselves do not necessarily contact each other in the seals, but they do extend and contact the metallization on the die they are used with and create contact through the seal with the sensor package. Due to manufacturing tolerances, the silicon pressure die must be slightly smaller then the package housing in order for the silicon die to fit into the housing. When compressed, the conductive seal can wrap over the edge of the die and short to N type epi causing a sensor error or failure. This problem is more pronounced for sensing higher pressures, but can exist in any pressure range.

What is needed is a way to overcome the problem of shorting because of the use of conductive elastomeric seals for making contact inside the pressure sensor packages.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

In accordance with one aspect of the present invention, a pressure sensor package is provided that comprises a die including a sensor and associated circuitry, an N-type epitaxy biased to a supply potential, an edge of the die made of P-type material and an elastomeric seal made of conductive material surrounding the edge of the die.

In accordance with another aspect of the present invention, the P-type diffusion creates a back biased PN junction at the edge of the sensor die such that if one of the signal pads shorts to the die edge it will not have an electrical path and not cause any adverse effect on the sensor function.

In accordance with another aspect of the present invention, a semiconductor pressure sensor wafer is processed by steps wherein: a p-type wafer is provided, an n-type epitaxy is grown on the wafer, a mask adapted for achieving isolation diffusion by using P-type doping material is obtained, and an isolation diffusion using P-type doping material is accomplished around the edge of the die which will eventually create an isolation region around the edge of the die after sawing and dicing the wafer.

The novel features of the present invention will become apparent to those of skill in the art upon examination of the following detailed description of the invention or can be learned by practice of the present invention. It should be understood, however, that the detailed description of the invention and the specific example presented, while indicating certain embodiments of the present invention, are provided for illustration purpose only because various changes and modifications within the scope of the invention will become apparent to those of skill in the art from the detailed description of the invention and claims that follow.

BRIEF DESCRIPTION OF DRAWINGS

The accompanying figures which is incorporated in and form part of the specification, further illustrate the present invention and, together with the detailed description of the invention, serve to explain the principles of the present invention.

DETAILED DESCRIPTION OF THE INVENTION

Pressure sensors are typically made by growing an N-type epitaxy layer on a P-type substrate. After dicing the wafer into individual die, the N-type epitaxy is exposed around the edge of the silicon die and under certain conditions this edge can come in contact with the conductive elastomeric seal. The conductive elastomeric seal is typically contacted to the top and/or bottom side of the silicon die, but under adverse conditions this seal can become wrapped around the edge of the die and can short out the topside contacts to the N-type epitaxy because the epi is actually biased up to the supply voltage.

Figure 1:
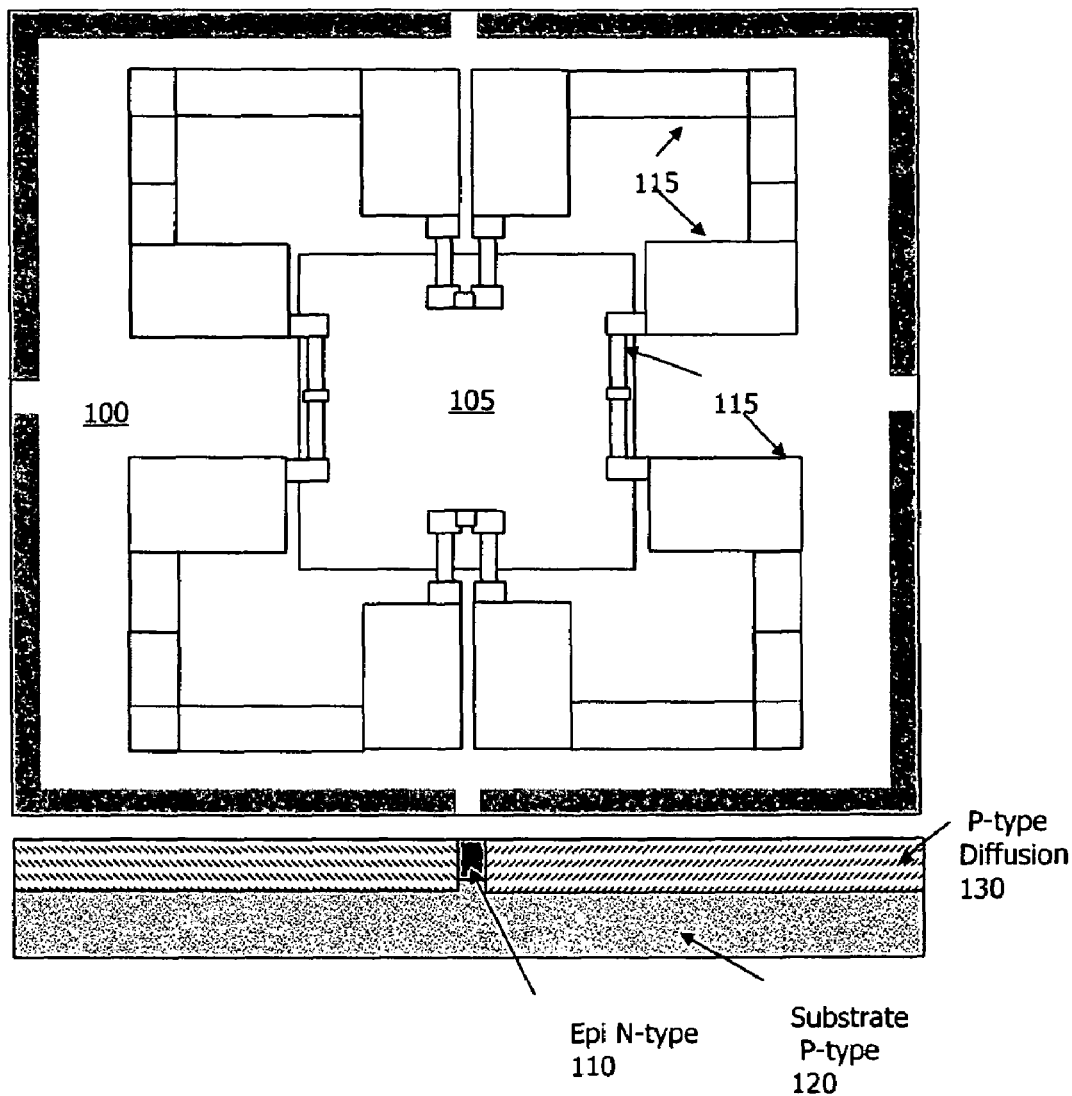
FIG. 1 illustrates a block diagram of a pressure sensor in accordance with the present invention.

As shown in FIG. 1, a P-type isolation region 130 is fabricated together with sensor diaphragm 105 and associated circuitry 115 on the silicon pressure sensor wafer 100 using a mask around the edge of an N-type material sensor die 110 and in contact with the P-type substrate 120, which then makes the edge of the die (P-type). The present inventors have found that if a new edge of the die 120 is instead made with P-type material, that will create a back-biased diode with the substrate 120, then shorting of a conductive elastomeric seal (when used), with the N-type die material 110 can be eliminated. Shorting is eliminated because P-diffusion already exists as an isolation region around the edge of the N-type epitaxal region of the die, while in contact with the P-type substrate 120. It should be noted that FIG. 1 is of a single pressure sensor die after fabrication and dicing and that the fabrication process described above is for a silicon wafer that would contain a plurality of devices in a manner common to those familiar with wafer processing. A new mask enables matching material use and elimination of shorting of conductive seals (not shown) with pressure sensor components. Typically isolation diffusion is conducted to keep the edge of the wafer from having problems during etching.

Figure 2:
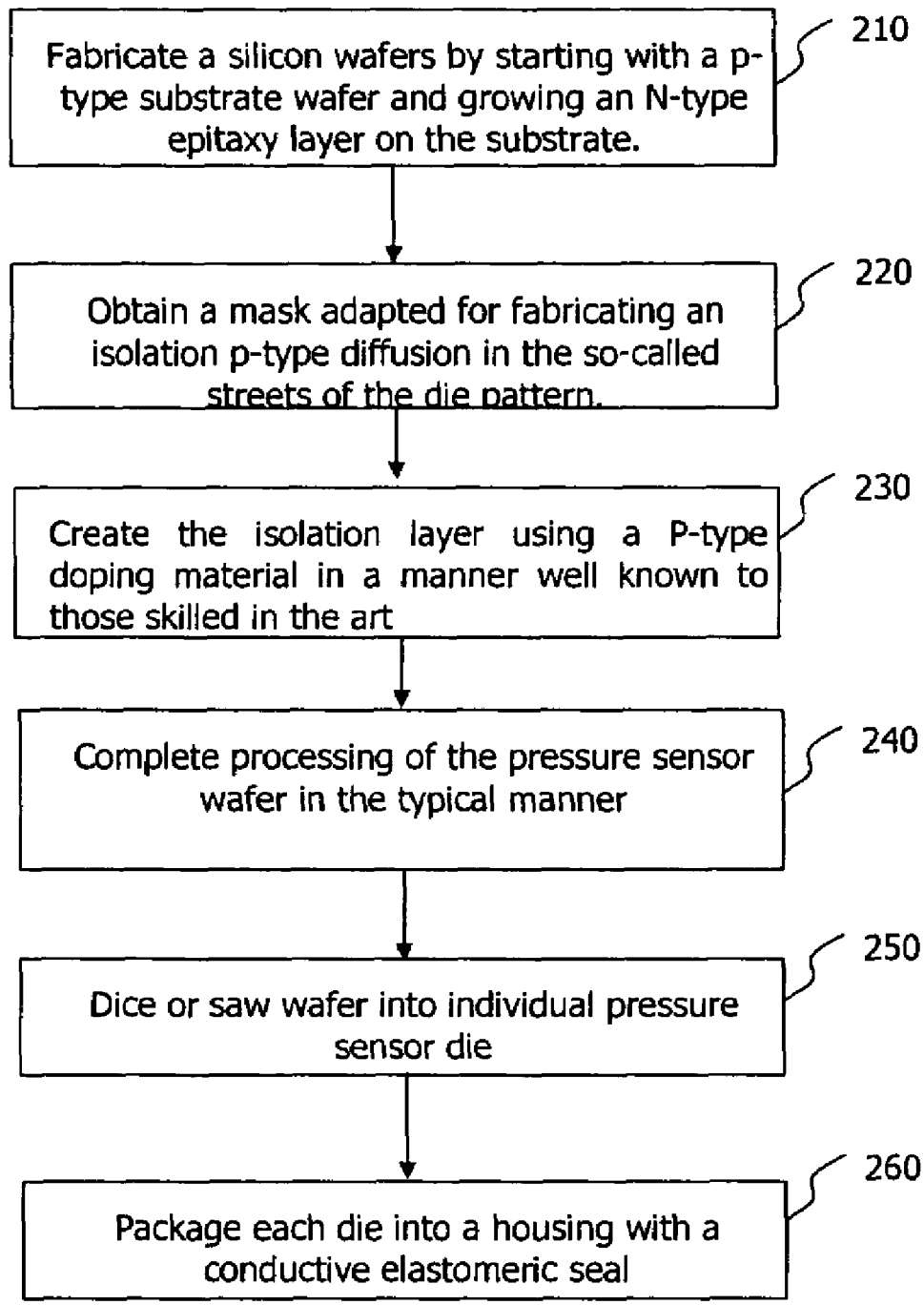
FIG. 2 illustrates a flow diagram for a process of fabricating a flow sensor in accordance with features of the present invention.

Referring to FIG. 2, a flow diagram of process steps for making a pressure sensor having a conductive elastomeric seal that prevent shorting with the die is shown. First, as shown in Block 210, a p-type wafer is provided; then as shown in Block 220, an n-type epitaxy is grown on the wafer. With these steps, a silicon wafer is fabricated by starting with a p-type substrate wafer and growing an N-type epitaxy layer on the substrate. Then, as shown in Block 230, a mask adapted for achieving isolation diffusion by using P-type material in the so-called streets of the die pattern is obtained. Finally, as shown in Block 240, isolation diffusion using P-type material is accomplished around the edge of the die using the mask to thereby cause patterning around the edge of the die. This step creates the isolation layer using a P-type doping material. To complete processing of a pressure sensor wafer fabricated in the foregoing manner, the wafer is then diced or sawed into individual pressure sensor dies as shown in Block 250. Then as shown in Block 260, each die is then packaged into a housing with a conductive elastomeric seal. With the resulting die design, incorporating a patterned insulator around the edge of each die, shorting is preventable.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The invention claimed is:

1. A method of making a pressure sensor, comprising:
    grow an n-type epitaxy layer on a p-type substrate wafer, resulting in a pressure sensor die and substrate having an edge;
    obtain a mask adapted for fabricating an isolation diffusion layer around the edge using P-type material; and
    creating an isolation layer diffusion using P-type material around the edge using the mask.

2. The method of claim 1 including the step wherein a conductive elastomeric seal is placed on top of the sensor die to make electrical contact from the sensor die to the leads that exit the package.

3. The method of claim 2 wherein a back biased PN junction is formed by the P-type isolation on the edge of the sensor die with the N-type epitaxy and prevents the conductive elastomeric seal from shorting the N-type epitaxy and sensor elements.

4. The method of claim 1 wherein a back biased PN junction is formed by the P-type isolation on the edge of the sensor die with the N-type epitaxy and prevents conductive elastomeric seals from shorting the N-type epitaxy and sensor elements.

5. The method of claim 1 including the step wherein a conductive elastomeric seal is placed on top of the sensor die to make electrical contact from the sensor die to the leads that exit the package.

6. The method of claim 2, wherein said conductive elastomeric seal engages the P-type isolation region so as to prevent shorting of the conductive elastomeric seal with the N-type epitaxal layer of the sensing element die.

7. The method of claim 6 wherein a back biased PN junction is formed by the P-type isolation on the edge of the sensor die with the N-type epitaxy and prevents the conductive elastomeric seal from shorting the N-type epitaxy and sensor elements.

8. The pressure sensor package of claim 1 wherein the pressure sensor die includes a Wheatstone bridge.

9. A method of making a pressure sensor comprising the steps of:
    growing an n-type epitaxy layer on a p-type substrate wafer, resulting in a pressure sensor die and substrate having an edge;
    obtaining a mask adapted for fabricating an isolation diffusion layer around the edge using P-type material;
    creating an isolation layer diffusion using P-type material around the edge using the mask;
    placing a conductive elastomeric seal over the top of the sensor die to make electrical contact to the package;
    cutting the wafer into individual pressure sensor dies; and
    packaging each die into a housing with a conductive elastomeric seal.

10. The method of claim 9 including the step wherein a conductive elastomeric seal is placed on top of the sensor die to make electrical contact from the sensor die to leads that exit the package.

11. The method of claim 9 wherein a back biased PN junction is formed by the P-type isolation on the edge of the sensor die with the N-type epitaxy and prevents conductive elastomeric seals from shorting the N-type epitaxy and sensor elements.

12. The method of claim 9, wherein said conductive elastomeric seal engages the P-type isolation region so as to prevent shorting of the conductive elastomeric seal with the N-type epitaxal layer of the sensing element die.

13. The method of claim 9 wherein the pressure sensor die includes a Wheatstone bridge.

14. A method of making a pressure sensor element package including:
   growing an n-type epitaxy layer on a P-type substrate wafer including a P-type isolation region located around the edge of a sensing element die and in contact with the P-type substrate; and
   fabricating a conductive elastomeric seal engaging the P-type isolation region so as to prevent shorting of the conductive elastomeric seal with the N-type epitaxal layer of the sensing element die, said steps of growing and fabricating resulting in a pressure sensing element.

15. The method of making a pressure sensor package in claim 14, wherein said N-type epitaxal lever is biased to a supply electrical potential to provide electrical power to the sensing element die.

16. The method of making a pressure sensor package of claim 14, wherein the sensing element die is fabricated to include a sensing element and associated circuitry fabricated thereon.

17. The method of making a pressure sensor package of claim 14 wherein the edge of the sensing element die is made of P-type material and an elastomeric seal is made of conductive material surrounding the edge of the die.

18. The method of making a pressure sensor package of claim 14 wherein the sensing element is fabricated to include Wheatstone bridge circuitry.

* * * * *